United States Patent [19]

Oh et al.

[11] Patent Number: 5,242,839

[45] Date of Patent: Sep. 7, 1993

[54] METHOD OF MANUFACTURING AN INTEGRATED PHOTOELECTRIC RECEIVING DEVICE

[75] Inventors: Kwang-Ryong Oh; Yong-Tak Lee, both of Daejeon, Rep. of Korea

[73] Assignee: Electronics and Telecommunications Research Institute, Rep. of Korea

[21] Appl. No.: 981,865

[22] Filed: Nov. 25, 1992

[30] Foreign Application Priority Data

Nov. 25, 1991 [KR] Rep. of Korea ............... 91-21083

[51] Int. Cl.⁵ ................ H01L 31/18; H01L 21/265; H01L 21/20
[52] U.S. Cl. .......................................... 437/5; 437/23; 437/29; 437/129; 437/133; 257/292; 257/458
[58] Field of Search ............... 437/29, 23, 51, 59, 437/63, 2–5, 129, 133; 257/27, 257, 273, 274, 292, 458; 148/DIG. 168

[56] References Cited

U.S. PATENT DOCUMENTS

| | | | |
|---|---|---|---|
| 4,719,498 | 1/1988 | Wada et al. | 257/292 |
| 4,774,205 | 9/1988 | Choi et al. | 437/59 |
| 4,879,250 | 11/1989 | Chan | 437/3 |
| 5,021,361 | 6/1991 | Kimoshita et al. | 437/129 |
| 5,051,372 | 9/1991 | Sasaki | 437/3 |

FOREIGN PATENT DOCUMENTS

405214 1/1991 European Pat. Off. ............ 257/292

*Primary Examiner*—Mary Wilczewski
*Assistant Examiner*—Ramamohan Rao Paladugu
*Attorney, Agent, or Firm*—Evenson, McKeown, Edwards & Lenahan

[57] ABSTRACT

The present invention relates to an integrated photoelectric receiving device in which a PIN-type photodetector and a junction field effect transistor (FET) are integrated in a single chip. The photoelectric receiving device comprises a photodetector having a n-channel layer, an etching stopper layer and an absorption layer formed on a semi-dielectric substrate, the n-channel layer, the etching stopper layer and the absorption layer being formed in a reverse mesa shape and the substrate being etched by a predetermined depth; a transistor having a n-channel layer, an etching stopper layer and a p-type InP layer sequentially formed on the non-etched portion of the semi-insulator substrate, the p-type InP layer having an absorption layer formed thereon in a reversedmesa shape. Also, the invention contemplates a method of manufacturing the device.

5 Claims, 6 Drawing Sheets

METHOD OF MANUFACTURING AN INTEGRATED PHOTOELECTRIC RECEIVING DEVICE

BACKGROUND OF THE INVENTION

1. Field of the Invention

The present invention relates to an integrated photoelectric receiving device in which a PIN-type photodetector and a junction field effect transistor (FET) for a pre-amplifier stage are integrated in a single chip, and a method of manufacturing the same.

2. Description of the Prior Art

In general, importants in determining the structure of such a integrated photoelectric receiving device or element are two kinds of processes achieved with differential structure and processing techniques, that is, independently optimizing the structure and process of a photodetector and a transistor, and electrically connecting the photodetector and the transistor.

Referring to FIG. 1, there are sequentially illustrated various examples of the integrated structure of such an integrated photoelectric receiving device presently disclosed.

More specifically, the structures of such a photoelectric receiving device are defined as below. That is, (a) a common epitaxial layer structure in which the photodetector and the transistor use commonly the same epitaxial layer (FIG. 1(a)); (b) an uneven structure integrated without respect to the difference in height of the photodetector and the transistor (FIG. 1(b)); (c) a recess trench structure in which a photodetector forming area is etched and the photodetector and the transistor are same in height (FIG. 1(c)); (d) a structure in which an edge of the device is tapered to reduce a step on the etched portion (FIG. 1(d)); (e) a buried planar buried structure in which the photodetector is buried to provide a complete planar shape (see FIG. 1(e)); (f) a compatible planar structure in which a planar photodetector is employed to assure a compatibility with planar electronic components in structure and process (FIG. 1(f)); and, (g) a structure in which the above-mentioned uneven and trench structures are composited (see FIG. 1(g)).

Figure 1A:
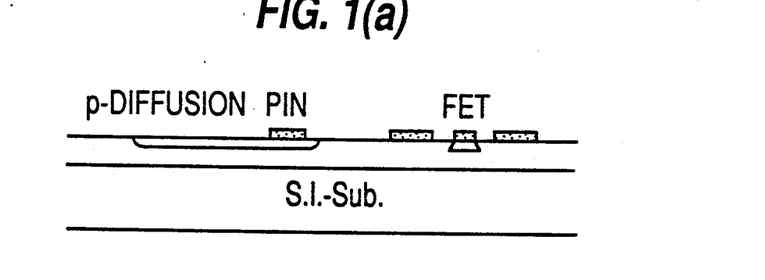
FIGS. 1(a) through 1(g) are views showing examplary structures of a conventional photoelectric receiving device, in which (a) is a view showing a common epitaxial layer structure, (b) is an uneven structure, (c) is a trench structure, (d) is a tapered structure, (e) is a buried planar structure, (f) is a compatible planer structure and (g) is a composite structure of the uneven and trench structures.

The common epitaxial layer structure of FIG. 1(a) is defined such that a single InGaAs layer is grown on a semi-dielectric InP substrate and a PIN-type photodetector element and a junction FET are then integrated over the entire surface of the substrate. This is referred to an initial structure including the first photoelectric receiving element.

According to the structure in FIG. 1(a), there is an advantage that a single epitaxial growing process is executed to obtain the same structure. But, differencies are presented in a doped density of a channel impurity and a thickness between the PIN-type photodetector and the transistor. As a result, it is difficult to assure an independent optimization in structure of the element and, therefore, the performance of the element is deteriorated undesirably.

Figure 1B:
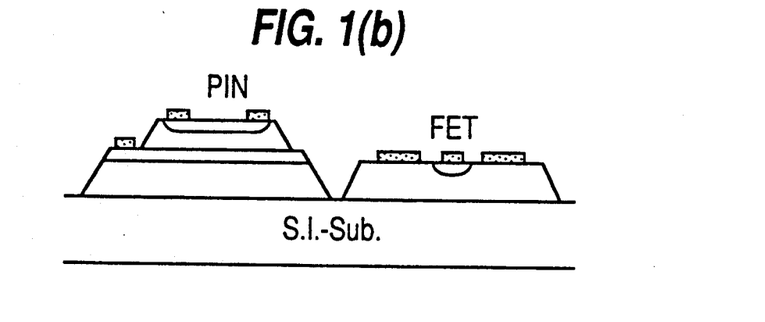

In the uneven structure shown in FIG. 1(b), a n-channel layer of the PIN-type photodetector is used as an electrode contact layer or channel layer of the FET so as to manufacture the device through a single epitaxial growing process. Further, because the channel layer of the transistor is different from an absorption layer of the photodetector, it is possible to independently optimize the transistor and photodetector.

With the preveously noted uneven structure, if the PIN-type photodetector is respectively thick, it is difficult to execute a fine lithography or wiring process. Further, an important in this case is that different condition must be employed to selectively etch the n-channel layer and absorption layer of the photodetector. Similar to the common epitaxial layer structure, this uneven structure has a problem resulted from a parasitic capacitance presented on the wiring.

Figure 1C:
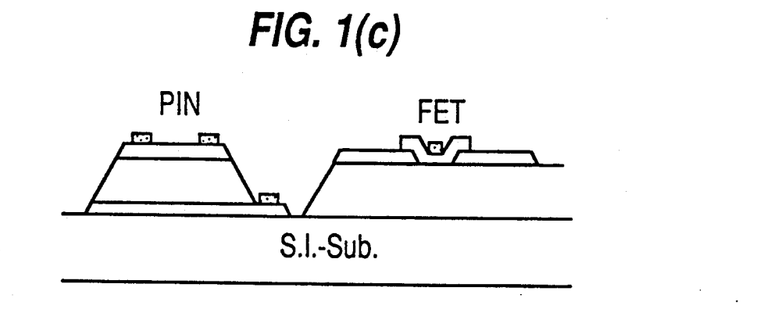

Accordingly to the trench structure shown in FIG. 1(c), because the photodetector is thicker than the transistor by 2 to 3 $\mu$m, a trench having a depth of 2 to 3 $\mu$m is formed on the semi-dielectric substrate to provide the same height of the photodetector and transistor and then the photodetector is buried in the trench.

With this trench structure, there is an advantage that a fine lithographic process can be easily executed. But, it is difficult to assure the electrical connection between the photodetector and the transistor, and a wiring capacitance is relatively reduced.

Figure 1D:
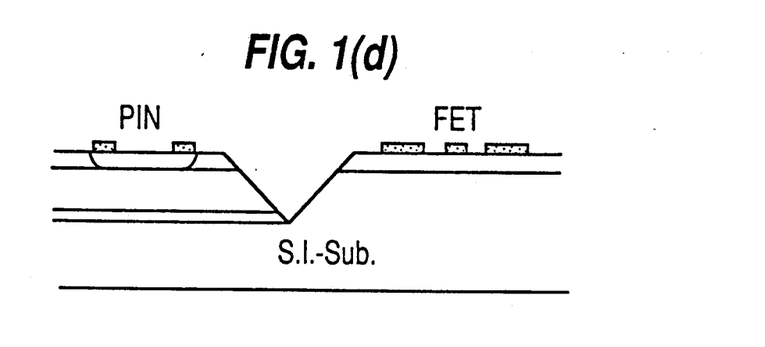

Meanwhile, in the tapered structure to reduce the surface step, as shown in FIG. 1(d), the problems resulted from the fine lithographic and wiring process as well as the wiring parasitic capacitance can be solved effectively.

Accordingly, the device having this structure has an excellent performance. But, it is troubled to fabricate such a structure using an ion beam etching process.

Figure 1E:
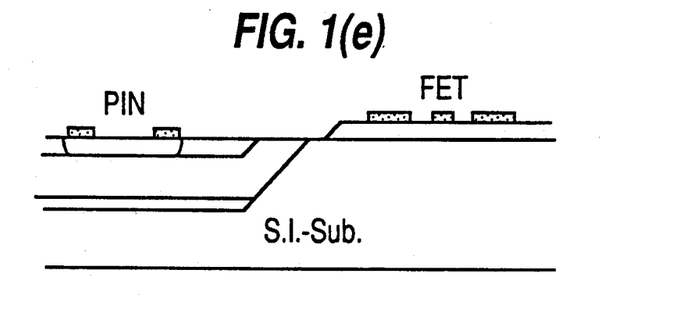

According to the buried planar structure shown in FIG. 1(e), the fine lithographic process and a wiring process can be easily achieved and the parasitic capacitance on the wire can be also reduced effectively without the problem related to the surface step. The integrated photoelectric device having such a tapered structure is fabricated by way of a method of filling the etched trench by using a property of a liquid epitaxy growing process, a method of using two ion beam etching processes, or a method of using a selective organic metal varpor epitaxy growing process (OMVEG). But, according to the liquid epitaxy growing process, an area of the photodetector is limited undesirably. In case of the ion beam etching process, it requires a very restricted control of the process. Further, according to the selective epitaxy method, a polycrystal structure can be grown over a material employed as a mask and an overgrow may be occurred on edge of the region to be grown.

Figure 1F:
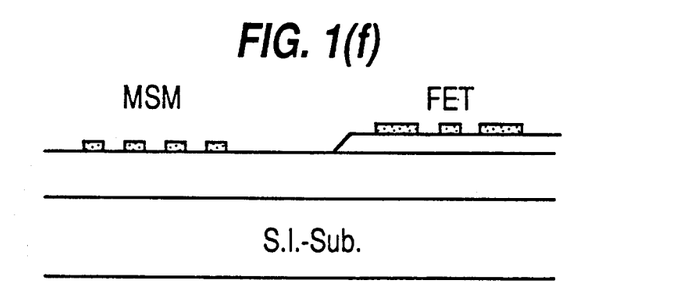

In the compatible planar structure shown an FIG. 1(f), a planar photodetector which employs the substrate itself as an absorption layer is integrated with a transistor such as a MESFET. As a result, it can achieves the simple manufacturing process and the planar structure can be preferably obtained.

But, because the development for such a planar photodetector is presently incomplete, it is difficult to be employed to an InP-base device using InGaAs epitaxial layer as an absorption layer.

Figure 1G:
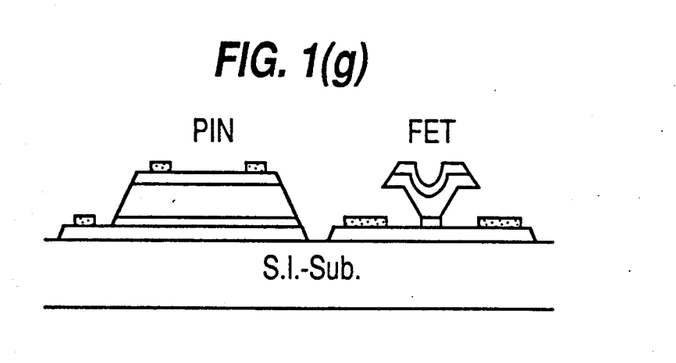

As shown in FIG. 1(g), the composite structure having properties of the uneven and the trench structures is achieved by integrating an uneven PIN-type photodetector and a junction FET. With this sturcture, it has an advantage that the property of the photodetetor and transistor can be simultaneously maximized by using two epitaxial crystal growing processes and a selective wet etching process.

With this composite structure, however, a distance between a gate and a source of the transistor is restrictedly defined. By the reason, it is difficult to maximize the performance of the device. Further, two lithographic processes are executed to form the gate. As a result, a reproduction or yield of the device is deteriorated undesirably.

In addition to the above-mentioned structures, there has been disclosed a vertical structure in which a PIN-type photodetector is formed on a n-type photodetector is formed on a n-type substrate, a semi-dielectric layer is epitaxially grown over the entire surface of the substrate and ion injection is then executed to the entire structure to obtain a FET element. Also, there have been disclosed a structure in which an InGaAs photodetector and a GaAs MESFET are integrated on a GaAs substrate by way of a lattice non-alining epitaxial process and a structure in which a GaAs MESFET is formed on an InP substrate.

For example, U.S. Pat. No. 4,830,986, issued to Richard. G. S. Plumb, etc., discloses a ridge waveguide laser structure is manufactured by a method including providing a photoresist stripe on an exposed area of a cap layer of a multilayer laser wafer; etching channels through the cap layer and a p passive layer using the stripe and an oxide layer window as a mask; evaporating a passivating and insulating oxide over the wafer, there being breaks in the oxide where the stripe is undercut during channel etching; and removing the stripe and the oxide on it by a lift-off technique.

Moreover, U.S. Pat. No. 4,888,784 assigned to shoji Hirata discloses a semiconductor laser device including a first semiconductor layer having a strip waveguide structure to obtain optical confinement and a second semiconductor layer having a ridge waveguide structure for defining an electrical current passage region. The strip waveguide structure has a first width, and projects on the first semiconductor layer, extending over the central area of the layer in a longitudinal direction. The ridge waveguide structure projects on the second semiconductor layer and extends in the longitudinal direction with a second width which corresponds to the strip structure. The strip waveguide structure cooperates with the ridge waveguide structure to produce a difference between the refractive index of a center region which extends in the longitudinal direction of the second semiconductor and that of a neighboring region due to the difference in thicknesses between the two, so that the center region serves as an optical waveguide.

SUMMARY OF THE INVENTION

Accordingly, an object of the present invention is to provide an integrated photoelectric receiving device of which a receiving sesitivity as well as high operating speed and reliability can be improved sufficiently.

Another object of the present invention is to provide a method of manufacturing an integrated photoelectric receiving device which can fabricate the device by way of a simple packaging process, saving a cost of manufacturing the device.

To achieve the objects, according to an aspect of the present invention there is provided a photoelectric receiving device comprising: a photodetector having a n-channel layer, an etching stopper layer and an absorption layer formed on a semi-dielectric substrate, the n-channel layer, the etching stopper layer and the absorption layer being formed in a reverse mesa shape and the substrate being etched by a predetermined depth; a transistor having a n-channel layer, an etching stopper layer and a p-type InP layer sequentially formed on the non-etched portion of the semi-dielectric substrate, the p-type InP layer having an absorption layer formed thereon in a reverse mesa shape.

According to another aspect of the present invention, there is provided a method of manufacturing an integrated photoelectric receiving device, comprising: etching a photodetector forming area of a predetermined depth on the substrate by using a selective etchant;

sequentially forming a n-type channel layer, an etching stopper layer and an absorption layer on the substrate etched;

removing the absorption layer excluding the photodetector forming area on the substrate by the selective etchant;

sequentially removing the etching stopper layer and the n-channel layer between the photodetector and the transistor forming areas to electrically insulate the photodetector and the transistor;

sequentially forming a p-type InP layer and a p-type InGaAs layer on the entire surface of the substrate exposed;

selectively etching the p-type InGaAs layer positioned on the photodetector forming area by a lithography process using a sensitive material as an etching mask;

forming p-type electrodes on the p-type InP layer on the photodetector forming area and the p-type InGaAs layer in the transistor forming area, respectively;

masking the photodetector forming area by way of a lithography process using the sensitive material as an etching mask and removing the p-type InGaAs layer the p-type InP layer and the etching stopper layer by using the p-type gate electrode as a mask;

depositing n-type metal layer on the n-type channel layer and any one of the p-type electrodes and forming an ohmic contact of a source and drain of the photodetector and the transistor;

coating a polyimide layer on the entire structure and etching the polyimide layer on electrode forming portions and photo-absorption portion of the photodetector and source and drain forming portions of the transistor; and, forming wiring metal layers on the electrode portions of the photodetector and a source and drain forming portion of the transistor.

According to the present invention thus constructed, a PIN type photodetector having a very excellent property is employed as the integrated photodetector, and the transistor having a shorter gate length can be easily fabricated.

The above and other objects, features and advantages of the present invention will be apparent from the following description taken in conjunction with the accompanying drawings.

DETAILED DESCRIPTION OF THE INVENTION

Thereinafter, a preferred embodiment of the present invention will be described in more detail.

Figure 2:
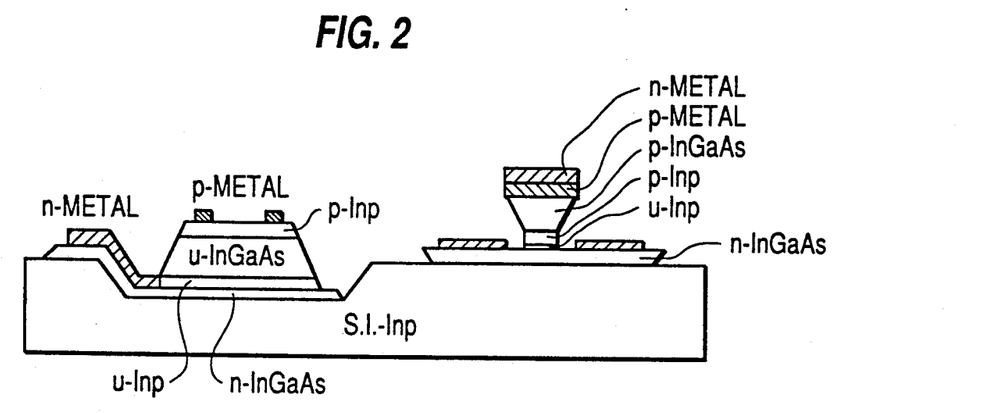
FIG. 2 is a cross-section view showing structure of an integrated InP-base photoelectric receiving device made according to a method of the present invention; and, FIGS. 3(a) through 3(k) are views illustrating a process of manufacturing the photoelectric receiving device according to the present invention.

FIG. 2 is a cross-section view showing a structure of an integrated InP-base photoelectric receiving device emboding the present invention. More specifically, this photoelectric receiving device comprises a PIN-type photodetector and a self-aligned junction FET which is horizontally integrated with the photodetector. The PIN-type photodetector has an $In_{0.53}Ga_{0.47}As$ serving as an absorption layer, and the FET has a n-type $In_{0.53}Ga_{0.47}As$ serving as a channel layer.

The structure of the photoelectric device made according to the method of the present invention corresponds to the trench structure in which the photodetector and the junction FET can be separately optimized, as previously described.

n-InGaAs layers grown by a first epitaxial growing process can be used as a channel layer of the transistor and a n-type electrode portion of the photodetector.

n-InGaAs layers is employed as only an absorption layer of the photodetector.

In addition, p-type InP layers simultaneously set the properties of the photodetector and transistor, and the property of the transistor may be increased by a p-type InGaAs layer.

According to the structure of the present invention, no a surface step is present between a part of the photodetector having the InGaAs absorption layer formed by etching the substrate to define a recess trench and a part of the transistor on which no the absorption layer is presented. Therefore, it is possible to achieve a fine lithography.

In the features of the present invention, a length of a gate shorter than a length of a mask determined by the lithography can be obtained by anistropically etching the InGaAs without the limitation in the gate length occurred due to the diffusion and resulted in a problem in a manufacturing the convertional junction FET. As a result, the junction FET having a gate length of 1 μm or less can be fabricated without employing an expensive electronic beam or X-ray lithography appliance. That is, the p-type InGaAs grown on the n-type InGaAs layer of the semi-dielectric InP substrate is etched by using a selective etchant such as sulfuric acid or phosphoric acid to develop a reverse mesa structure (a surface 3 3 2). Simultaneously, the p-type InP is vertically etched by using the selective etchant such as phosphoric acid or sulfuric acid. Accordingly, a short gate can be achieved satisfactorily. As noted above, the gate length on which a p/n junction surface is formed depends upon the thickness of the p-type InGaAs layer, an angle of anistropic etching process and a length of a gate etching mask. Because the gate portion is defined in a form of a reverse mesa, a source and drain forming metal material can be deposited by a self-alignment process and, therefore, a resistance between the gate and source can be sufficiently minimized.

According to the present invention, the gate length depends upon a size of the gate metal mask formed by a single lithography process so that the transistor can be fabricated with facility.

Further, according to the structure of the present invention, the integration density of the transistors can be improved without changing the basic structure thereof. The InP layer and InGaAs layer are subjected to various etching processes and a control of the etching process can be thus facilitated.

FIG. 3 is views illustrating a process of manufacturing the device according to the present invention.

Figure 3A:
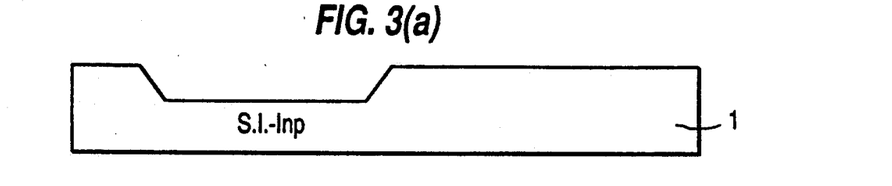

Referring to FIG. 3(a), there is shown an etching process by which a trench is fromed on the semi-dielectric InP substrate 1. In the drawing, an etching mask made of a sensitive material (not shown) is deposited on the substrate 1 by way of an ordinary lithography. The substrate 1 is etched by way of a wet etching process using an InP selective etchant (i.e., $HCl: H_3PO_4$) in a height corresponding to the photodetector so that no a surface step between a photodetector forming region and the transistor region is presented.

Figure 3B:
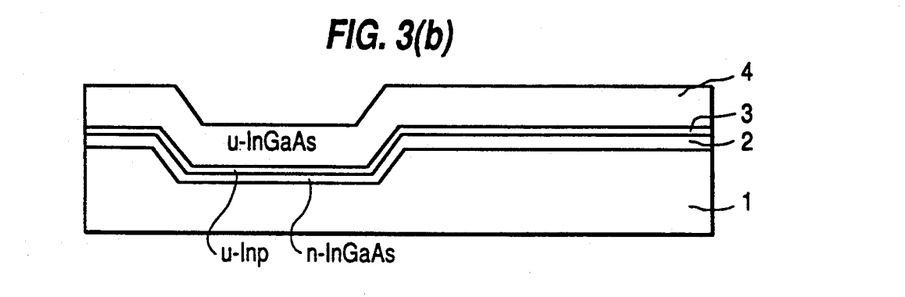

As shown in FIG. 3(b), after the sensitive material is entirely removed, a n-type InGaAs channel layer 2, an InP serving as an etching stopper layer 3 and a non-doped InGaAs absorption layer 4 are sequentially deposited on the semi-dielectric InP substrate 1 by way of a liquid epitaxy growing method or OMVEG method.

Figure 3C:
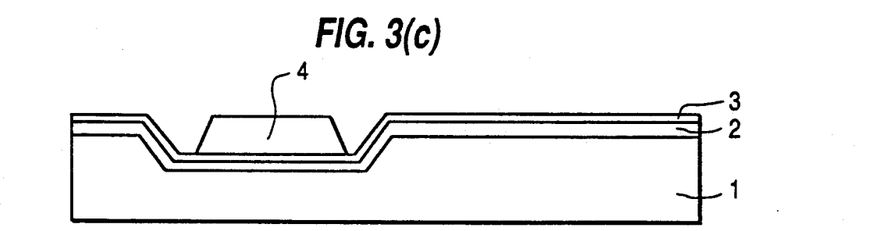

Consequently, as shown in FIG. 3(c) an etching mask made of a sensitive material formed by way of an ordinary lithography and the non-doped InGaAs layer 4 excluding the photodetector forming area is removed by an etching using a selective etchant such as $H_2SO_4: H_2O$, $H_3PO_4: H_2O$ or the like.

Figure 3D:
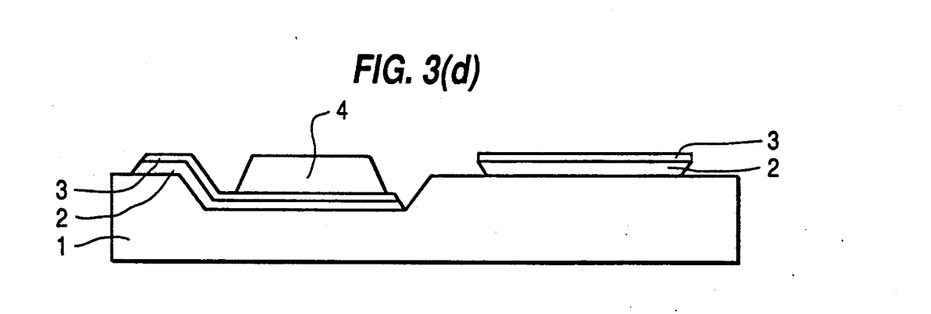

After the removal of the sensitive material as shown in FIG. 3(d), an etching mask made of a sensitive material is deposited over the entire surface by way of an ordinary lithography so as to etch the etching stopper layer 3 and the channel layer 2 between the photodetector and transistor.

Figure 3E:
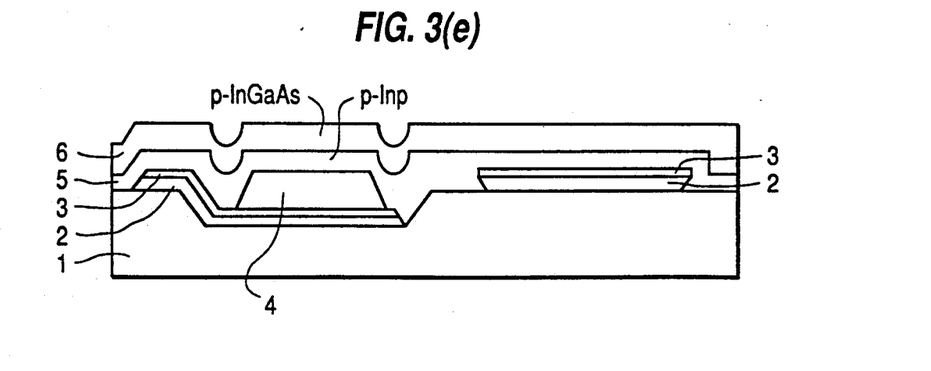

As shown in FIG. 3(e), after the sensitive material is entirely removed, a p-type InP layer 5 is grown by an ordinary OMVEG method to achieve the PIN and PN junction of the photodetector and transistor. On the entire surface, a p-type InGaAs layer 6 is additionally grown in order to improve the contact resistance of a gate portion of the transistor and to embody a shorter channel by selectively etching InGaAs in a form of a reverse mesa.

Figure 3F:
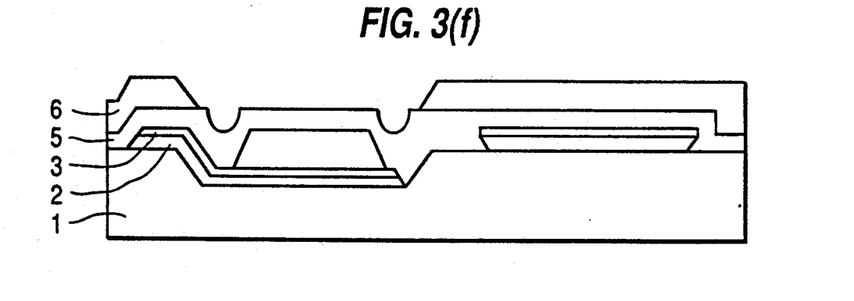

Sequentially, in FIG. 3(f) an etching mask made of a sensitive material is formed by way of a lithography and the p-type InGaAs layer 6 on the photodetector region is removed by an etching process using a selective etchant so as to minimize the loss of the photo-absorption.

Figure 3G:
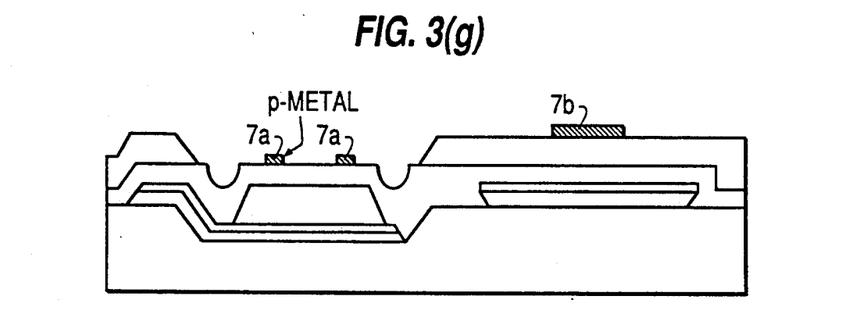

As shown in FIG. 3(g), the sensitive material is completely removed and a plurality of p-type electrodes of the photodetector and transistor are then deposited by way of a lift-off method.

Figure 3H:
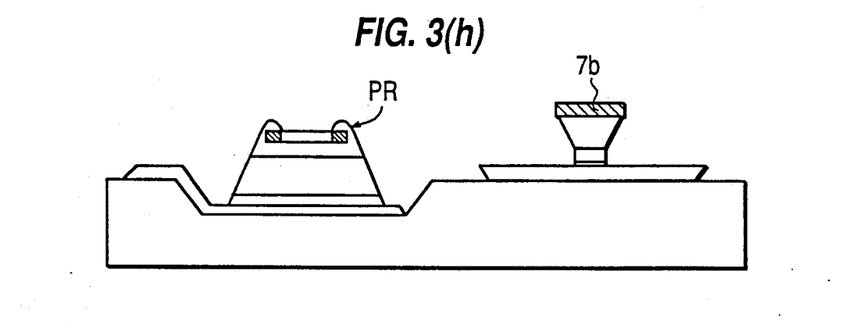

Thereinafter, an etching mask of a sensitive material is formed by an ordinary lithography so as to mask the photodetector forming area. On the gate area of the transistor, a p-type metal layer serving as an etching mask deposited by the electrode depositing process. Under this state, the p-type InGaAs layer 6 and the p-type InP layer 5 are removed by an etching process using the above-mentioned selective etchant. At this time, the p-type InGaAs layer 6 is etched in a form of reverse mesa. As a result, a gate having a length shorter than the metal mask for the gate can be obtained. Preferably, the p-type InP layer 5 is substantially vertically etched.

Figure 3I:
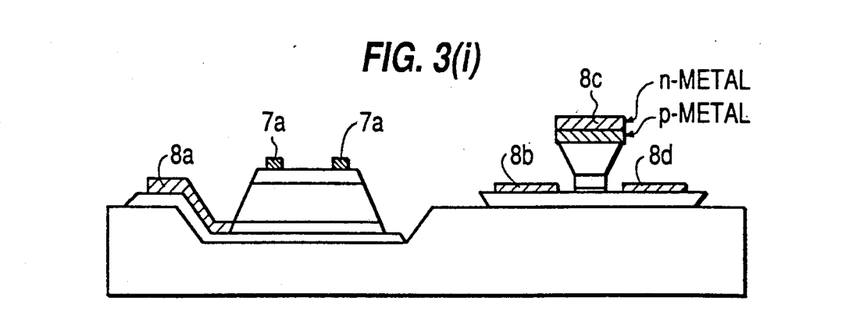

In FIG. 3(i), after the sensitive material is completely removed, n-type metal layers 8a to 8d are deposited on the entire surface by the ordinary lift-off method to achieve the ohmic contact of the source and drain of the photodetector and transistor, respectively. When the source, drain and gate portions of the transistor are simultaneously deposited, each of the electrodes can be self-aligned according to the reverse mesa-shaped p-type InGaAs layer 6.

Figure 3J:
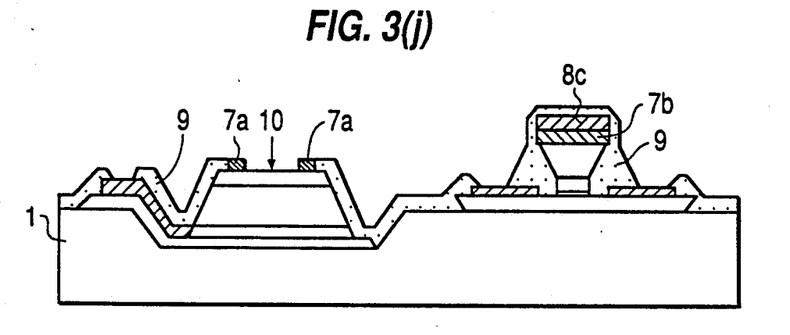
Figure 3K:
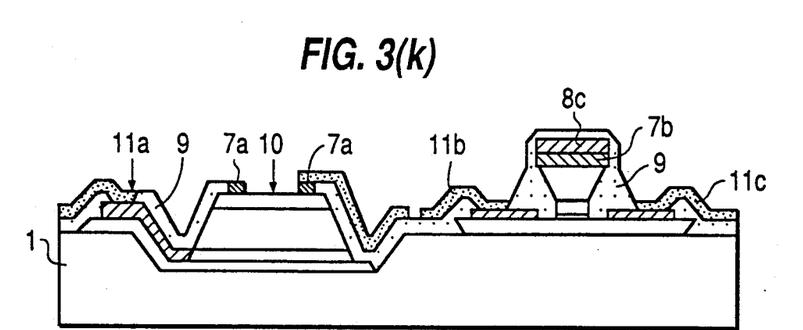

Next, as shown in FIG. 3(j) a polyimide 9 is coated on the entire structure to assure the reduction of leak current and the alleviation of tapered surface of the photodetector. Consequently, the polyimide 9 is partially etched to provide the photo-absorption area of the photodetector and the secondary wiring metal contact portion for an electric connection between the elements. Thereinafter, wiring metal layers 11a to 11c are deposited on the entire structure by way of the lift-off method to provide the electric wiring between the elements, as shown in FIG. 3(k).

According to the present invention, of course, various changes and modifications will be made as below.

That is, in a preferred aspect of the invention, a wavelength of the light beam absorbed by the photodetector is 1.3 μm or less than, the u-InGaAs layer 4 formed as shown in FIG. 3(b) may be substituted by an InGaAs P layer to obtain desirably integrated photoelectric device.

According to another aspect of the invention, a p-type InGaAs P having a band gap of 1.1 μm-order may be grown in lieu of the p-type InP layer 5 and the p-type InGaAs layer 6 shown in FIG. 3(e) and the selective etching process illustrated in FIG. 3(f) can be omitted.

In a further preferred aspect of the invention, the photoelectric integrated device made according to the present invention can be applied to a GaAs-base device without any change of the structure. More specifically, the semi-dielectric InP substrate 1 may be substituted by a semi-dielectric GaAs substrate, and a n-type GaAs channel layer may be employed in lieu of the n-type InGaAs 2. Also, a p-type GaAlAs layer instead of the p-type InP layer 5 and a p-type GaAs layer insted of the p-type InGaAs may be grown and a process of selectively etching GaAs and GaAlAs can be employed effectively.

The photoelectric receiving integrated device made according to the present invention, therefore, has the following advantages in structure, as compared with the existing photoelectric receiving device.

More specifically, because most of the photoelectric integrated device has the photodetector having a height of several μm and the FET having a height of 1 μm or less which are integrated therein, a fine lithography process is likely to be restricted by the surface step between the photodetector and the FET, with a result that it is difficult to manufacture the transistor having shorter gate length. By this reason, in the existing structure of the photoelectric integrated device, the buried planner photodetector or planar photodetector having a relatively lower surface step is employed. But, since it is very difficult to execute the planar buration process using an ion beam etching or selective epitaxy, a yield and reliability of the device is likely to be decreased. Further, a planar photodetector such as a PCD or MSM is deteriorated in performance and reliability as compared with the PIN-type photodetector and also restricted in material.

According to the present invention, the PIN-type photodetector having an extremely excellent performance is employed as an integrated photodetector. Further, the transistor having a shorter gate length can be fabricated by the manufacturing process including the substrate recess etching, the first epitaxy, the first selective etching, the second epitaxy and the fine lithography by which the gate length of the transistor is effectively set. The field effect transistor FET can be easily fabricated in self-alignment formation and a gate of the FET can be formed by a single lithography process.

Meanwhile, the existing structure, the performance of the photodetector and transistor cannot be simultaneously maximized. Alternatively, the structure made according to the present invention is defined such that the photodetector and transistor can be separately maximized in performance.

Although the present invention has been described with reference to the specified examples, various modifications and changes will be made therein without departing from the scope and spirit of the invention.

What is claimed is:

1. A method of manufacturing an integrated photoelectric receiving device having a photodetector and a transistor formed on a semi-dielectric substrate, the method comprising the steps of:

a) etching a photodetector forming area of a predetermined depth on the substrate by using a selective etchant;

b) sequentially forming a n-type channel layer, an etching stopper layer and an absorption layer on the substrate etched;

c) removing the absorption layer excluding the photodetector forming area on the substrate by the selective etchant;

d) sequentially removing the etching stopper layer and the type n-channel layer between the photodetector and the transistor forming areas to electrically insulate the photodetector and the transistor;

e) sequentially forming a p-type InP layer and a p-type InGaAs layer on the entire surface of the substrate exposed;

f) selectively etching the p-type InGaAs layer positioned on the photodetector forming area by a lithography process using a sensitive material as an etching mask;

g) forming p-type electrodes on the p-type InP layer defined on the photodetector forming area and the p-type InGaAs layer in the transistor forming area, respectively;

h) masking the photodetector forming area by way of a lithography process using the sensitive material as an etching mask and removing the p-type InGaAs layer, the p-type InP layer and the etching stopper layer by using the p-type gate electrode as a mask;

i) depositing n-type metal layer on the n-type channel layer and any one of the p-type electrodes and forming an ohmic contact of a source and drain of the photodetector and the transistor;

j) coating a polyimide layer on the entire structure and etching the polyimide layer on the electrode forming portion and photo-absorption portion of the photodetector and the source and drain forming portions of the transistor; and, k) forming wiring metal layers on the electrode portions of the photodetector and the source and drain forming portions of the transistor.

2. A method of manufacturing an integrated photoelectric receiving device according to claim 1, wherein at the step (h) the p-type InGaAs layer on the transistor forming area is etched in a form of reverse mesa, and the p-type InP layer is perpendicularly etched.

3. A method of manufacturing an integrated photoelectric receiving device according to claim 1, wherein the absorption layer formed in the step (b) is an InGaAs p-type layer.

4. A method of manufacturing an integrated photoelectric receiving device having a photodetector and a transistor formed on a semi-dielectric substrate, the method comprising the steps of:
   a) etching a photodetector forming area of a predetermined depth on the substrate by using a selective etchant;
   b) sequentially forming a n-type channel layer, an etching stopper layer and an absorption layer 4 on the substrate etched;
   c) removing the absorption layer excluding a photodetector forming area on the substrate by using the selective etchant;
   d) sequentially removing the etching stopper layer and the n-channel layer between the photodetector and the transistor forming areas to electrically separate the photodetector and the transistor;
   e) forming a p-type InGaAs layer of the order 1.1 μm thick on the entire surface of the substrate exposed;
   f) forming p-type electrodes on the InGaAs layer defined on a photodetector forming area of the substrate;
   g) masking the photodetector forming area by way of a lithography process using the sensitive material as an etching mask and removing the p-type InGaAs layer, the p-type InP layer and the etching stopper layer by using the a gate electrode of the p-type electrodes as a mask;
   h) depositing n-type metal areas on the n-type channel layer and the p-type electrode and forming an ohmic contact of a source and drain of the photodetector and the transistor;
   i) coating a polyimide layer on the entire structure and etching the polyimide layer on electrode forming areas and light absorption area of the photodetector and source and drain forming portions of the transistor; and,
   j) forming wiring metal on the electrode portons of the photodetector and the source and drain forming portions of the transistor.

5. A method of manufacturing an integrated photoelectric receiving device having a photodetector and a transistor formed an a single semi-dielectric GaAs substrate, the method comprising the steps of:
   a) etching a photodetector froming area of a predetermined depth on the substrate by using a selective etchant;
   b) sequentially forming a n-type GaAs channel layer, an AlGaAs etching stopper layer, a GaAs absorption layer on the substrate etched;
   c) removing the absorption layer excluding a photodetector forming area of the substrate by the selective etchant;
   d) sequentially removing the etching stopper layer and the n-channel layer between the photodetector and transistor forming areas to electrically insulate the photodetector and the transistor;
   e) sequentially forming a p-type GaAlAs layer and a p-type GaAs layer on the entire surface of the substrate exposed;
   f) selectively etching the p-type GaAs layer positioned on the photodetector forming area by a lithography process using a sensitive material as an etching mask;
   g) forming p-type electrodes on the p-type GaAlAs layer defined on the photodetector forming area and definding the p-type GaAs layer on the transistor forming area, respectively;
   h) masking the photodetector forming area by way of a lithography process using the sensitive material as an etching mask and removing the p-type GaAs layer, the p-type GaAlAs layer and the etching stopper by using the a gate electrode of the p-type electrodes as a mask;
   i) depositing n-type metal areas on the n-type channel layer and the p-type electrode and forming an ohmic contact of a source and drain of the photodetector and the transistor;
   j) coating a polyimide layer on the entire structure and etching the polyimide layer on electrode and photo-absorption portions of the photodetector and a source and drain forming portion of the transistor; and,
   k) forming wiring metal layer on the electrode portions of the photodetector and the source and drain forming portion of the transistor.

* * * * *